(12) United States Patent
Etou

(10) Patent No.: US 11,206,038 B2
(45) Date of Patent: Dec. 21, 2021

(54) SUCCESSIVE APPROXIMATION REGISTER ANALOG-TO-DIGITAL CONVERTER

(71) Applicant: SONY SEMICONDUCTOR SOLUTIONS CORPORATION, Kanagawa (JP)

(72) Inventor: Shinichirou Etou, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/959,775

(22) PCT Filed: Dec. 18, 2018

(86) PCT No.: PCT/JP2018/046584
§ 371 (c)(1),
(2) Date: Jul. 2, 2020

(87) PCT Pub. No.: WO2019/138804
PCT Pub. Date: Jul. 18, 2019

(65) Prior Publication Data
US 2020/0343901 A1 Oct. 29, 2020

(30) Foreign Application Priority Data

Jan. 12, 2018 (JP) .............................. JP2018-003216

(51) Int. Cl.
*H03M 1/38* (2006.01)
*H03M 1/46* (2006.01)

(52) U.S. Cl.
CPC .................................. *H03M 1/466* (2013.01)

(58) Field of Classification Search
CPC .... H03M 1/466; H03M 1/462; H03M 1/1245; H03M 1/38; H03M 1/804; H03M 1/12;
(Continued)

(56) References Cited

U.S. PATENT DOCUMENTS 9,391,627 B1 * 7/2016 Srinivasa ................ H03M 1/38
9,654,131 B1 * 5/2017 Fuchs .................... H03M 1/466
(Continued)

FOREIGN PATENT DOCUMENTS

CN 102859882 A 1/2013
CN 107070454 A 8/2017
(Continued)

OTHER PUBLICATIONS

International Search Report and Written Opinion of PCT Application No. PCT/JP2018/046584, dated Apr. 2, 2019, 08 pages of ISRWO.

*Primary Examiner* — Linh V Nguyen
(74) *Attorney, Agent, or Firm* — Chip Law Group

(57) ABSTRACT

A first successive approximation register analog-to-digital converter according an embodiment of the present disclosure includes an N-bit (N represents an integer greater than or equal to 5) capacitive digital-to-analog converter including a plurality of capacitive elements. A plurality of first capacitive elements of the plurality of capacitive elements is capacitive elements that have total capacity corresponding to total capacity of a plurality of the capacitive elements corresponding to a whole or a portion of first to (N−1)-th bits, and do not correspond to the first to (N−1)-th bits.

10 Claims, 8 Drawing Sheets

(58) Field of Classification Search
CPC ...... H03M 1/442; H03M 1/001; H03M 1/403; H03M 1/00; H03M 1/46
USPC .................. 341/122, 155, 161, 162, 172
See application file for complete search history.

(56) References Cited

U.S. PATENT DOCUMENTS

| | | | |
|---|---|---|---|
| 10,862,498 B1 * | 12/2020 | Chen | H03M 1/1009 |
| 10,868,558 B1 * | 12/2020 | Tripurari | H03M 1/462 |
| 2010/0283645 A1 * | 11/2010 | Haneda | H03M 1/0639 341/122 |
| 2011/0260899 A1 | 10/2011 | Snedeker | |
| 2013/0015996 A1 | 1/2013 | Furuta | |
| 2015/0194981 A1 * | 7/2015 | Tang | H03M 1/442 341/172 |
| 2016/0126967 A1 * | 5/2016 | Oh | H03M 1/1057 341/118 |
| 2016/0226507 A1 * | 8/2016 | Baek | H03M 1/38 |
| 2017/0077937 A1 | 3/2017 | Shu | |
| 2017/0134036 A1 * | 5/2017 | Huang | H03M 1/109 |
| 2017/0302281 A1 * | 10/2017 | Ning | G01T 7/005 |
| 2018/0269893 A1 * | 9/2018 | Chang | H03M 1/804 |

FOREIGN PATENT DOCUMENTS

| | | |
|---|---|---|
| EP | 3288186 A1 | 2/2018 |
| JP | 2013-021555 A | 1/2013 |
| JP | 2013-526179 A | 6/2013 |
| JP | 2016-025552 A | 2/2016 |
| JP | 2017-060159 A | 3/2017 |
| WO | 2011/133193 A1 | 10/2011 |

\* cited by examiner

SUCCESSIVE APPROXIMATION REGISTER ANALOG-TO-DIGITAL CONVERTER

CROSS REFERENCE TO RELATED APPLICATIONS

This application is a U.S. National Phase of International Patent Application No. PCT/JP2018/046584 filed on Dec. 18, 2018, which claims priority benefit of Japanese Patent Application No. JP 2018-003216 filed in the Japan Patent Office on Jan. 12, 2018. Each of the above-referenced applications is hereby incorporated herein by reference in its entirety.

TECHNICAL FIELD

The present disclosure relates to a successive approximation register analog-to-digital converter.

BACKGROUND ART

In recent years, any type of electronic apparatus has been mounted with an analog-to-digital converter (ADC) that converts analog signals to digital signals. Especially recently, a low-cost and high-performance successive approximation register ADC (that is referred to as "SAR (Successive Approximation Resister) ADC" below) has been known that finds a wide product use.

CITATION LIST

Patent Literature

PTL 1: Japanese Unexamined Patent Application Publication No. 2016-25552

SUMMARY OF THE INVENTION

Incidentally, in SARADC, capacitive DAC is used for binary search comparison. A capacitive array included in this capacitive DAC has a mismatch. This causes a high-order spurious emission or deteriorates linearity in some cases. Examples of countermeasures include DAC mismatch Error Shaping technology. This technology, however, narrows the dynamic range of the SARADC. It is thus desirable to provide SARADC whose dynamic range is expandable.

A first successive approximation register analog-to-digital converter according an embodiment of the present disclosure includes an N-bit (N represents an integer greater than or equal to 5) capacitive digital-to-analog converter including a plurality of capacitive elements. A plurality of first capacitive elements of the plurality of capacitive elements is capacitive elements that have total capacity corresponding to total capacity of a plurality of the capacitive elements (that is referred to as "second capacitive elements" below) corresponding to a whole or a portion of first to (N−1)-th bits, and do not correspond to the first to (N−1)-th bits.

In the first successive approximation register analog-to-digital converter according to the embodiment of the present disclosure, the plurality of first capacitive elements is the capacitive elements that have the total capacity corresponding to the total capacity of the plurality of second capacitive elements, and do not correspond to the first to (N−1)-th bits (that are referred to as "low bits" below). This makes it possible to reduce a DC shift that the output voltage of the capacitive digital-to-analog converter may undergo by inputting, for example, last ((k−1)-th time's) ADC conversion results to the respective capacitive elements corresponding to the low bits while inputting inverted signals of the last ((k−1)-th time's) ADC conversion results that are inputted to the respective second capacitive elements to the respective first capacitive elements, sampling the analog signal in this state, and then inputting reset signals to the respective capacitive elements.

A second successive approximation register analog-to-digital converter according an embodiment of the present disclosure includes an N-bit (N represents an integer greater than or equal to 4) capacitive digital-to-analog converter including a plurality of capacitive elements. One first capacitive element of the plurality of capacitive elements is a capacitive element that has capacity corresponding to capacity of the one capacitive element (that is referred to as "second capacitive element" below) included in first to (N−1)-th bits, and does not correspond to first to N-th bits.

In the second successive approximation register analog-to-digital converter according to the embodiment of the present disclosure, the one first capacitive element is the capacitive element that has the capacity corresponding to the capacity of the one second capacitive element, and does not correspond to the first to (N−1)-th bits (that are referred to as "low bits" below). This makes it possible to reduce a DC shift that the output voltage of the capacitive digital-to-analog converter may undergo by inputting, for example, a last ((k−1)-th time's) ADC conversion result to each of the capacitive elements corresponding to the low bits while inputting an inverted signal of the last ((k−1)-th time's) ADC conversion result that is inputted to the one second capacitive element to the one first capacitive element, sampling the analog signal in this state, and then inputting a reset signal to each of the capacitive elements.

MODES FOR CARRYING OUT THE INVENTION

The following describes modes for carrying out the present disclosure in detail with reference to the drawings. It is to be noted that description is given in the following order.

1. First Embodiment

[Configuration]

Figure 1:
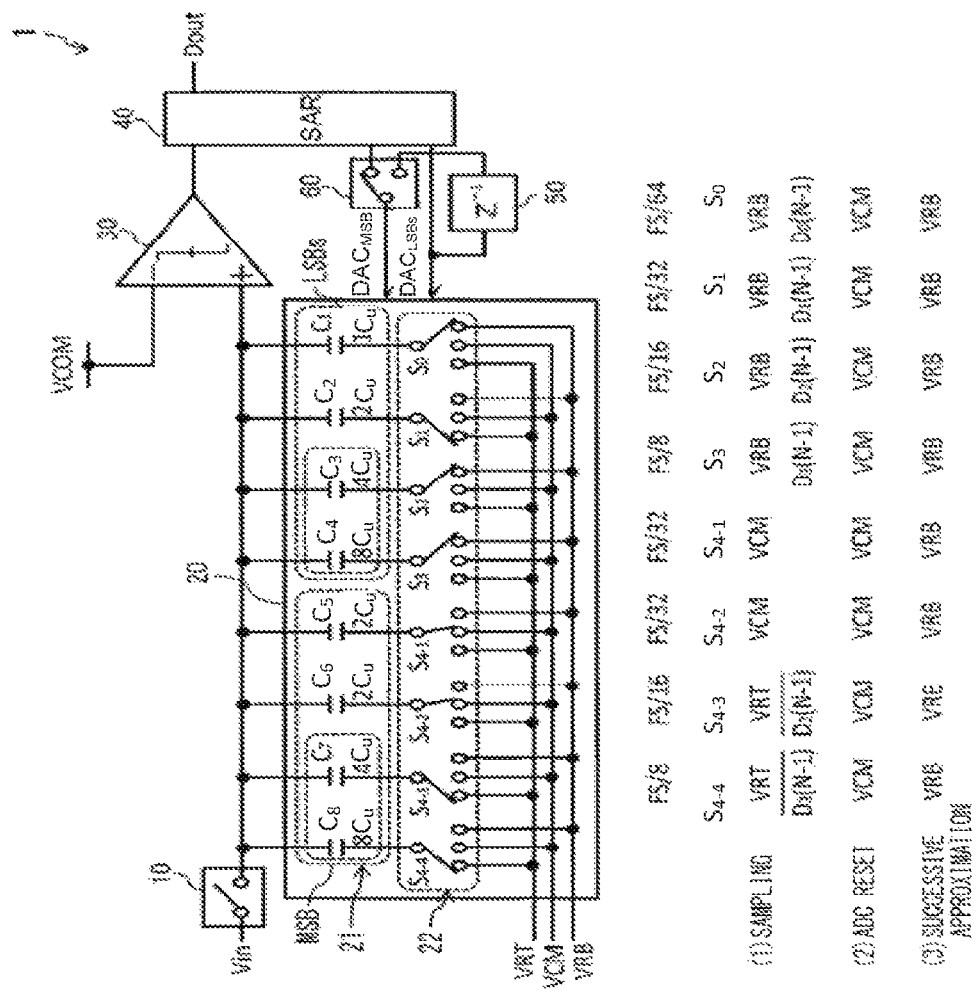
FIG. 1 is a diagram illustrating an overview of a successive approximation register analog-to-digital converter according to a first embodiment of the present disclosure.

A successive approximation register analog-to-digital converter 1 according to a first embodiment of the present disclosure is described. FIG. 1 illustrates an overview of the successive approximation register analog-to-digital converter 1. The successive approximation register analog-to-digital converter 1 converts an analog signal Vin inputted from the outside to an N-bit (N represents an integer greater than or equal to 5) digital signal Dout. The successive approximation register analog-to-digital converter 1 includes, for example, a switch 10, capacitive DAC 20, a comparator 30, a successive approximation register 40, an inverter 50, and a selector 60.

The switch 10 samples the analog signal Vin in predetermined cycles. The switch 10 includes, for example, a switch element.

The capacitive DAC 20 is N-bit capacitive DAC including a plurality of capacitive elements. It is to be noted that FIG. 1 exemplifies, as the plurality of capacitive elements, eight capacitive elements $C_1$, $C_2$, $C_3$, $C_4$, $C_5$, $C_6$, $C_7$, and $C_8$ described below, for example. The capacity values of the respective capacitive elements $C_1$, $C_2$, $C_3$, $C_4$, $C_5$, $C_6$, $C_7$, and $C_8$ in FIG. 1 are illustrated near the respective capacitive elements. In addition, FIG. 1 exemplifies 5-bit capacitive DAC as the capacitive DAC 20. The capacitive DAC 20 includes N−1 capacitive elements corresponding to low-order bits LSBs (first to (N−1)-th bits) and a plurality of capacitive elements corresponding to a most significant bit MSB (N-th bit). Examples of the N−1 capacitive elements corresponding to the low-order bits LSBs (first to (N−1)-th bits) include the four capacitive elements $C_1$, $C_2$, $C_3$, and $C_4$ corresponding to the first to fourth bits. Examples of the plurality of capacitive elements corresponding to the most significant bit MSB (N-th bit) include the four capacitive elements $C_5$, $C_6$, $C_7$, and $C_8$ corresponding to the fifth bit.

The low-order bits LSBs include, for example, the four capacitive elements $C_1$, $C_2$, $C_3$, and $C_4$. In the low-order bits LSBs, the capacitive element $C_1$ is a capacitive element corresponding to the first bit (least significant bit LSB), the capacitive element $C_2$ is a capacitive element corresponding to the second bit, the capacitive element $C_3$ is a capacitive element corresponding to the third bit, and the capacitive element $C_4$ is a capacitive element corresponding to the fourth bit.

The capacity of the respective capacitive elements corresponding to the low-order bits LSBs (first to (N−1)-th bits) is defined in (N−1)-bit binary. For example, the capacity of the respective capacitive elements $C_1$, $C_2$, $C_3$, and $C_4$ respectively corresponding to the low-order bits LSBs (first to fourth bits) is defined in 4-bit binary. For example, the capacity of the capacitive element $C_1$ is $1C_u$, the capacity of the capacitive element $C_2$ is $2C_u$, the capacity of the capacitive element $C_3$ is $4C_u$, and the capacity of the capacitive element $C_4$ is $8C_u$.

The most significant bit MSB includes a plurality of capacitive elements. FIG. 1 illustrates, for example, the four capacitive elements $C_5$, $C_6$, $C_7$, and $C_8$ as the plurality of capacitive elements corresponding to the most significant bit MSB. The plurality of capacitive elements (e.g., four capacitive elements $C_5$, $C_6$, $C_7$, and $C_8$) corresponding to the most significant bit MSB is capacitive elements corresponding to the N-th bit (e.g., fifth bit), and capacitive elements that do not correspond to the first to (N−1)-th bits (e.g., first to fourth bits).

The plurality of capacitive elements (first capacitive elements) corresponding to the whole or a portion of the most significant bit MSB has the total capacity corresponding to the total capacity of the plurality of capacitive elements (second capacitive elements) corresponding to the whole or a portion of the low-order bits LSBs (first to (N−1)-th bits). For example, the capacity of the plurality of first capacitive elements corresponds to the capacity of the plurality of capacitive elements (third capacitive elements) corresponding to high-order bits (M-th to (N−1)-th bits (M represents an integer greater than or equal to 1 and less than or equal to N−1)) in the low-order bits LSBs (first to (N−1)-th bits). For example, the total capacity of the plurality of first capacitive elements corresponds to the total capacity of the plurality of capacitive elements (third capacitive elements) corresponding to the whole of the high-order bits (M-th to (N−1)-th bits) in the low-order bits LSBs (first to (N−1)-th bits). For example, as illustrated in FIG. 1, the capacity of the two capacitive elements $C_7$ and $C_8$ (first capacitive elements) surrounded by the dashed line in the most significant bit MSB corresponds to the capacity of the two capacitive elements $C_3$ and $C_4$ (third capacitive elements) surrounded by the dashed line in the low-order bits LSBs. For example, as illustrated in FIG. 1, the capacity of the two capacitive elements $C_7$ and $C_8$ (first capacitive elements) surrounded by the dashed line in the most significant bit MSB corresponds to the total capacity ($4C_u + 8C_u = 12C_u$) of the two capacitive elements $C_3$ and $C_4$ (third capacitive elements) surrounded by the dashed line in the low-order bits LSBs. The two capacitive elements $C_7$ and $C_8$ surrounded by the dashed line in the most significant bit MSB in FIG. 1 correspond to specific examples of the "plurality of first capacitive elements", the "capacitive elements corresponding to the N-th bit", and the "capacitive elements that do not correspond to the first to N-th bits" of the present disclosure.

The capacity of the plurality of capacitive elements (first capacitive elements) corresponding to the whole or a portion of the most significant bit MSB then corresponds to the capacity of the plurality of capacitive elements (third capacitive elements) corresponding to the M-th to (N−1)-th bits in the low-order bits LSBs. For example, as illustrated in FIG. 1, the two capacitive elements $C_7$ and $C_8$ (first capacitive elements) and the two capacitive elements $C_3$ and $C_4$ (third capacitive elements) include common capacitive elements. For example, the capacity of the capacitive element $C_5$ is $2C_u$, the capacity of the capacitive element $C_6$ is $2C_u$, the capacity of the capacitive element $C_7$ is $4C_u$, and the capacity of the capacitive element $C_8$ is $8C_u$.

The capacitive DAC 20 further includes a capacitive element array 21 and a switch element array 22. The capacitive element array 21 includes the plurality of capacitive elements corresponding to the low-order bits LSBs and the most significant bit MSB. The switch element array 22 includes the plurality of switch elements coupled to the capacitive element array 21. One end of each capacitive element included in the capacitive element array 21 is coupled to a common node. The respective switch elements included in the switch element array 22 independently couple the other ends of the respective capacitive elements included in the capacitive element array 21 to any of a lowest reference voltage VRB, a common voltage VCM, and a highest reference voltage VRT.

The comparator 30 compares, for example, the voltage (comparison signal) of the common node (output of the capacitive DAC 20) and a standard voltage (common voltage VCM), and outputs a determination result of the magnitude relationship therebetween to the successive approximation register 40.

The successive approximation register 40 successively accumulates output signals of the comparator 30 and outputs the digital signal Dout. The successive approximation register 40 further outputs, for example, the digital signal Dout to the capacitive DAC 20 as control signals ($DAC_{MSB}$ and $DAC_{LSBs}$).

The selector 60 controls the switching of the coupling between the capacitive element array 21 and the plurality of voltage lines (respective voltage lines of the lowest reference voltage VRB, common voltage VCM, and highest reference voltage VRT) via the switch element array 22. The selector 60 selects the control signal $DAC_{MSB}$ outputted from the successive approximation register 40 and outputs the selected control signal $DAC_{MSB}$ to the capacitive DAC 20 at the time of successive approximation. The selector 60 selects a control signal $DAC_{LSBs}'$ outputted from the inverter 50 and outputs the selected control signal $DAC_{LSBs}'$ to the capacitive DAC 20 as the control signal $DAC_{MSB}$ (first control signal) at the time of sampling the analog signal Vin.

The inverter 50 generates the control signal $DAC_{LSBs}'$ from the control signal $DAC_{LSBs}$ outputted from the successive approximation register 40. The inverter 50 generates, for example, inverted signals of control signals of the control signals $DAC_{LSBs}$ for the plurality of switch elements corresponding to the plurality of capacitive elements (third capacitive elements) corresponding to the M-th to N1-th bits. For example, when "1" is inputted from the successive approximation register 40, the inverter 50 generates "0" as an inverted signal. For example, when "0" is inputted from the successive approximation register 40, the inverter 50 generates "1" as an inverted signal. The inverter 50 further replaces, for example, control signals of the control signals $DAC_{LSBs}$ for the plurality of switch elements corresponding to the plurality of capacitive elements (third capacitive elements) corresponding to the M-th to (N-1)-th bits with the above-described inverted signals, thereby generating the control signals $DAC_{LSBs}'$.

[Operation]

Figure 2:
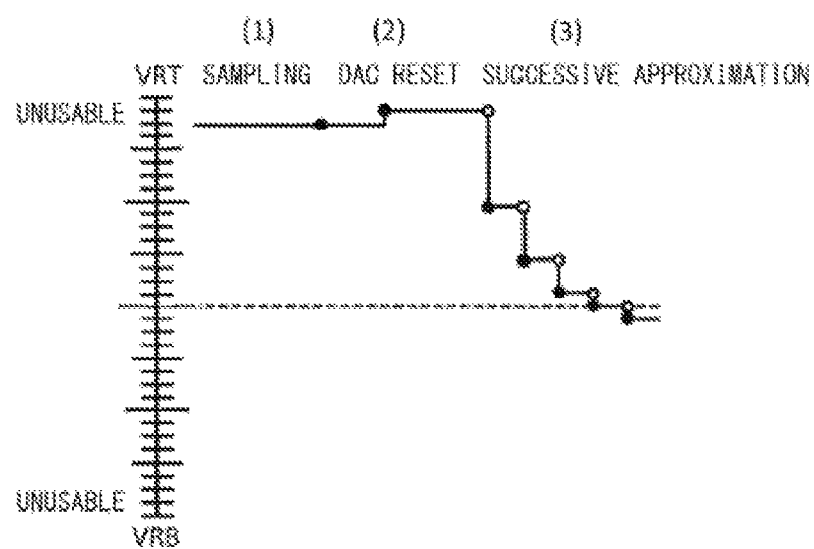
FIG. 2 is a diagram illustrating an example of a temporal change in an output voltage of capacitive DAC in the successive approximation register analog-to-digital converter in FIG. 1.
Figure 3:
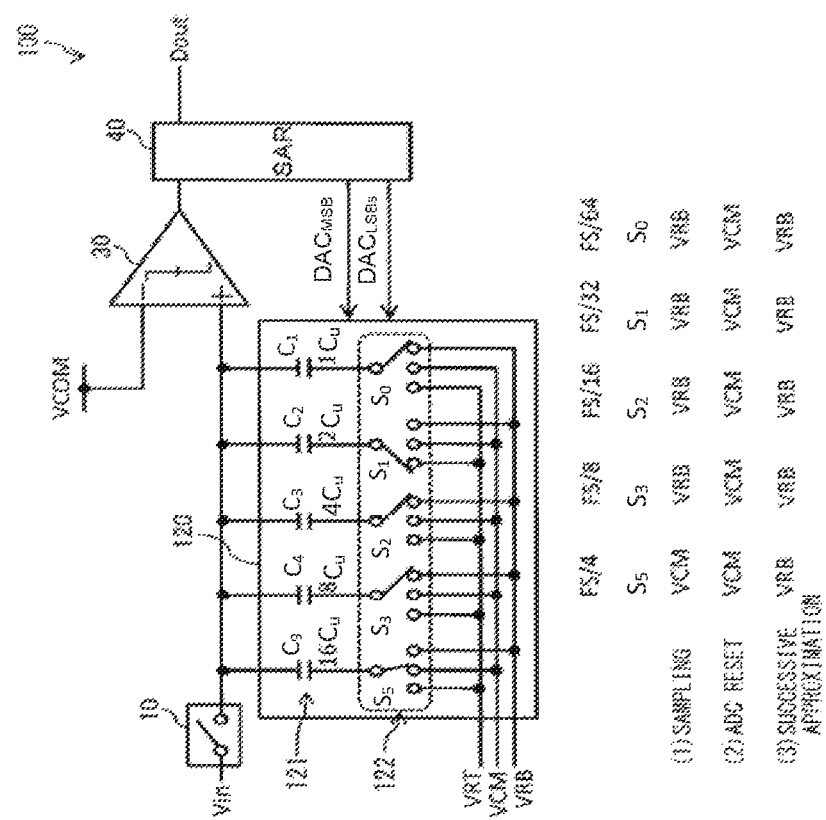
FIG. 3 is a diagram illustrating an overview of a successive approximation register analog-to-digital converter according to a comparative example.
Figure 4:
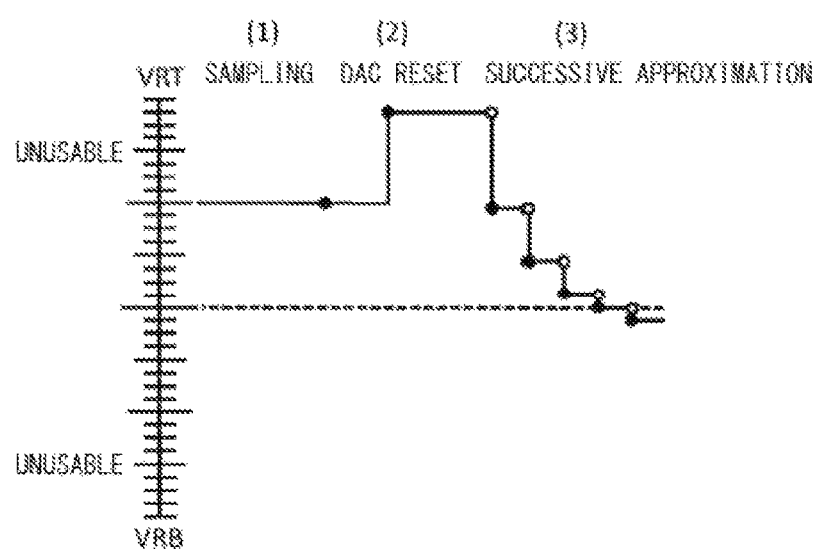
FIG. 4 is a diagram illustrating an example of a temporal change in an output voltage of capacitive DAC in the successive approximation register analog-to-digital converter in FIG. 3.

Next, the operation of the successive approximation register analog-to-digital converter 1 according to the present embodiment is described. First, the capacity of the most significant bit MSB is configured with binary weighting. A switch is added to allow each binary to be controlled. This samples an analog signal in a sampling operation by inverting control signals of the capacitive elements other than the most significant bit MSB. Specifically, as illustrated in FIG. 1, an analog signal is sampled with $S_{4-3}$=VRT and $S_{4-4}$=VRT because of $S_3$=VRB and $S_4$=VRB. Next, the capacitive DAC 20 is reset. At that time, in a method according to a comparative example, an output voltage of a capacitive DAC 120 undergoes a DC shift because of $S_3$=VCM and $S_4$=VCM as illustrated in FIGS. 3 and 4, but in the present embodiment, it is possible to cancel the DC shift because of VRT-VCM=VCM-VRB. Performing a normal successive approximation operation after the completion of resetting makes it possible to expand the voltage range within which AD conversion is possible for the capacitive elements other than the most significant bit MSB, for example, as illustrated in FIG. 2 while taking advantage of a DAC mismatch Error Shaping effect.

[Effects]

Next, the effects of the successive approximation register analog-to-digital converter 1 according to the present embodiment are described.

In recent years, any type of electronic apparatus has been mounted with ADC that converts analog signals to digital signals. Especially recently, low-cost and high-performance SARADC has been known that finds a wide product use.

Incidentally, in SARADC, capacitive DAC is used for binary search comparison. A capacitive array included in this capacitive DAC has a mismatch. This causes a high-order spurious emission or deteriorates linearity in some cases. Examples of countermeasures include DAC mismatch Error Shaping technology. This technology, however, narrows the dynamic range of the SARADC.

In contrast, in the successive approximation register analog-to-digital converter 1 according to the present embodiment, the plurality of capacitive elements (first capacitive elements) corresponding to the whole or a portion of the most significant bit MSB has the total capacity corresponding to the total capacity of the plurality of capacitive elements (second capacitive elements) corresponding to the whole or a portion of the low-order bits LSBs (first to (N-1)-th bits). Further, the plurality of first capacitive elements is capacitive elements that do not corresponding to low bits. This makes it possible to reduce a DC shift that the output voltage of the capacitive digital-to-analog converter may undergo by inputting, for example, last ((k-1)-th time's) ADC conversion results to the respective capacitive elements corresponding to the low bits while inputting inverted signals of the last ((k-1)-th time's) ADC conversion results that are inputted to the respective second capacitive elements to the respective first capacitive elements, sampling the analog signal in this state, and then inputting reset signals to the respective capacitive elements. As a result, it is possible to expand the dynamic range of the successive approximation register analog-to-digital converter 1.

In addition, in the present embodiment, the plurality of first capacitive elements is capacitive elements corresponding to the most significant bit MSB (N-th bit). This makes it possible to reduce a DC shift that the output voltage of the capacitive digital-to-analog converter may undergo by inputting, for example, last ((k-1)-th time's) ADC conversion results to the respective capacitive elements corresponding to the low bits while inputting inverted signals of the last ((k-1)-th time's) ADC conversion results that are inputted to the respective second capacitive elements to the respective first capacitive elements, sampling the analog signal in this state, and then inputting reset signals to the respective capacitive elements. As a result, it is possible to expand the dynamic range of the successive approximation register analog-to-digital converter 1.

In addition, in the present embodiment, the capacity of the respective capacitive elements corresponding to the low-order bits LSBs (first to (N-1)-th bits) is defined in (N-1)-bit binary. The capacity of the plurality of first capacitive elements corresponds to the capacity of the plurality of capacitive elements (third capacitive elements) corresponding to high-order bits (M-th to (N-1)-th bits (M represents an integer greater than or equal to 1 and less than or equal to N-1)) in the low-order bits LSBs (first to (N-1)-th bits). This makes it possible to reduce a DC shift that an output voltage if the capacitive digital-to-analog converter 1 may undergo. As a result, it is possible to expand the dynamic range of the successive approximation register analog-to-digital converter 1.

In addition, in the present embodiment, the total capacity of the plurality of first capacitive elements corresponds to the total capacity of the plurality of capacitive elements (third capacitive elements) corresponding to the whole of the high-order bits (M-th to (N−1)-th bits) in the low-order bits LSBs (first to (N−1)-th bits). This makes it possible to reduce a DC shift that an output voltage if the capacitive digital-to-analog converter 1 may undergo. As a result, it is possible to expand the dynamic range of the successive approximation register analog-to-digital converter 1.

In addition, in the present embodiment, inverted signals of control signals for the plurality of switch elements corresponding to the plurality of capacitive elements (third capacitive elements) corresponding to the M-th to (N−1)-th bits are outputted as the control signals $DAC_Ms$ (first control signals) for the plurality of switch elements corresponding to the plurality of first capacitive elements when the analog signal Vin is sampled. This makes it possible to reduce a DC shift that an output voltage if the capacitive digital-to-analog converter 1 may undergo. As a result, it is possible to expand the dynamic range of the successive approximation register analog-to-digital converter 1.

2. Second Embodiment

[Configuration]

Figure 5:
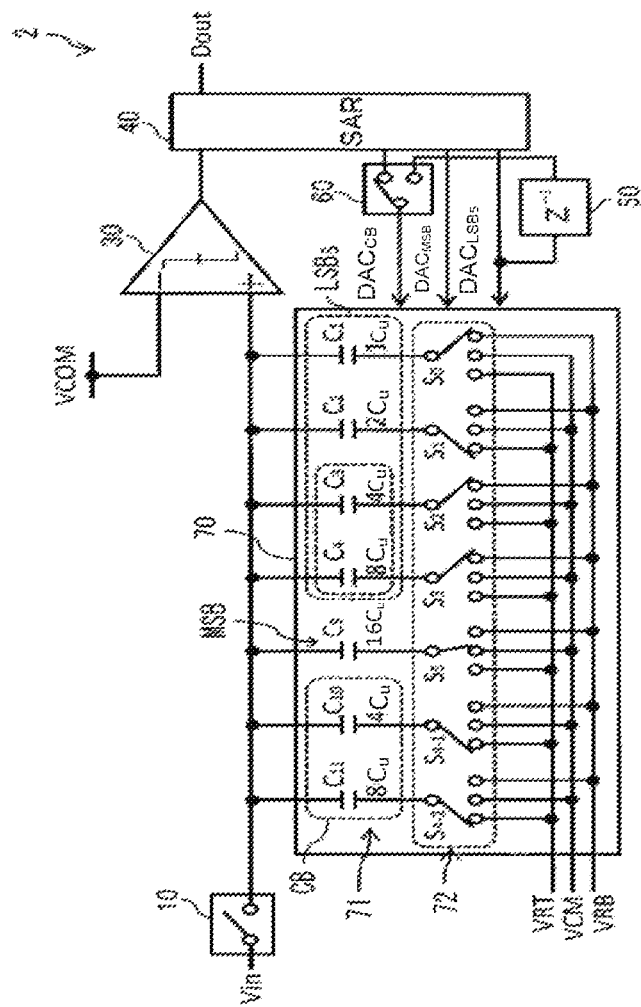
FIG. 5 is a diagram illustrating an overview of a successive approximation register analog-to-digital converter according to a second embodiment of the present disclosure.

A successive approximation register analog-to-digital converter 2 according to a second embodiment of the present disclosure is described. FIG. 5 illustrates an overview of the successive approximation register analog-to-digital converter 2. The successive approximation register analog-to-digital converter 2 converts the analog signal Vin inputted from the outside to the N-bit (N represents an integer greater than or equal to 5) digital signal Dout. The successive approximation register analog-to-digital converter 2 includes, for example, the switch 10, capacitive DAC 70, the comparator 30, the successive approximation register 40, the inverter 50, and the selector 60.

The capacitive DAC 70 is N-bit capacitive DAC including a plurality of capacitive elements. It is to be noted that FIG. 5 exemplifies, as the plurality of capacitive elements, the seven capacitive elements $C_1$, $C_2$, $C_3$, $C_4$, $C_9$, $C_{10}$, and $C_{11}$ described below, for example. The capacity values of the respective capacitive elements $C_1$, $C_2$, $C_3$, $C_4$, $C_9$, $C_{10}$, and $C_{11}$ in FIG. 5 are illustrated near the respective capacitive elements. In addition, FIG. 5 exemplifies 5-bit capacitive DAC as the capacitive DAC 70. The capacitive DAC 70 includes N−1 capacitive elements corresponding to the low-order bits LSBs (first to (N−1)-th bits), one capacitive element corresponding to the most significant bit MSB (N-th bit), and a plurality of capacitive elements for correction. Examples of the N−1 capacitive elements corresponding to the low-order bits LSBs (first to (N−1)-th bits) include the four capacitive elements $C_1$, $C_2$, $C_3$, and $C_4$ corresponding to the first to fourth bits. Examples of the one capacitive element corresponding to the most significant bit MSB (N-th bit) include the one capacitive element $C_9$ corresponding to the fifth bit. Examples of a plurality of capacitive elements corresponding to a correction bit CB include the two capacitive elements $C_{10}$ and $C_{11}$.

The most significant bit MSB includes one capacitive element. FIG. 5 illustrates, for example, the one capacitive element $C_9$ as the one capacitive element corresponding to the most significant bit MSB. The one capacitive element (e.g., one capacitive element $C_9$) corresponding to the most significant bit MSB is a capacitive element corresponding to the N-th bit (e.g., fifth bit), and a capacitive element that does not correspond to the first to (N−1)-th bits (e.g., first to fourth bits). The plurality of capacitive elements (e.g., two capacitive elements $C_{10}$ and $C_{11}$) corresponding to the correction bit CB is capacitive elements that do not correspond to the first to N-th bits.

The plurality of capacitive elements (first capacitive elements) corresponding to the whole or a portion of the correction bit CB has the total capacity corresponding to the total capacity of the plurality of capacitive elements (second capacitive elements) corresponding to the whole or a portion of the low-order bits LSBs (first to (N−1)-th bits). For example, the capacity of the plurality of first capacitive elements corresponds to the capacity of the plurality of capacitive elements (third capacitive elements) corresponding to the high-order bits (M-th to (N−1)-th bits) in the low-order bits LSBs (first to (N−1)-th bits). For example, the total capacity of the plurality of first capacitive elements corresponds to the total capacity of the plurality of capacitive elements (third capacitive elements) corresponding to the whole of the high-order bits (M-th to (N−1)-th bits) in the low-order bits LSBs (first to (N−1)-th bits). For example, as illustrated in FIG. 5, the capacity of the two capacitive elements $C_{10}$ and $C_{11}$ (first capacitive elements) in the correction bit CB corresponds to the capacity of the two capacitive elements $C_3$ and $C_4$ (third capacitive elements) surrounded by the dashed line in the low-order bits LSBs. For example, as illustrated in FIG. 5, the capacity of the two $C_{10}$ and $C_{11}$ (first capacitive elements) in the correction bit CB corresponds to the total capacity ($4C_u+8C_u=12C_u$) of the two capacitive elements $C_3$ and $C_4$ (third capacitive elements) surrounded by the dashed line in the low-order bits LSBs. The two capacitive elements $C_{10}$ and $C_{11}$ surrounded by the dashed line in the correction bit CB in FIG. 5 correspond to specific examples of the "plurality of first capacitive elements" and the "capacitive elements that do not correspond to the first to N-th bits" of the present disclosure.

The capacity of the plurality of capacitive elements (first capacitive elements) corresponding to the whole or a portion of the correction bit CB then corresponds to the capacity of the plurality of capacitive elements (third capacitive elements) corresponding to the M-th to (N−1)-th bits in the low-order bits LSBs. For example, as illustrated in FIG. 5, the two capacitive elements $C_{10}$ and $C_{11}$ (first capacitive elements) and the two capacitive elements $C_3$ and $C_4$ (third capacitive elements) include common capacitive elements. For example, the capacity of the capacitive element $C_{10}$ is $4C_u$, and the capacity of the capacitive element $C_{11}$ is $8C_u$.

The capacitive DAC 70 further includes a capacitive element array 71 and a switch element array 72. The capacitive element array 71 includes the plurality of capacitive elements corresponding to the low-order bits LSBs, the most significant bit MSB, and the correction bit CB. The switch element array 72 includes the plurality of switch elements coupled to the capacitive element array 71. One end of each capacitive element included in the capacitive element array 71 is coupled to a common node. The respective switch elements included in the switch element array 72 independently couple the other ends of the respective capacitive elements included in the capacitive element array 71 to any of the lowest reference voltage VRB, the common voltage VCM, and the highest reference voltage VRT.

The selector 60 controls the switching of the coupling between the capacitive element array 71 and the plurality of voltage lines (respective voltage lines of the lowest reference voltage VRB, common voltage VCM, and highest reference voltage VRT) via the switch element array 72. The selector 60 selects the control signal $DAC_{CB}$ outputted from the successive approximation register 40 and outputs the selected control signal $DAC_{CB}$ to the capacitive DAC 70 at the time of successive approximation. The selector 60 selects a control signal $DAC_{CB}'$ outputted from the inverter 50 and outputs the selected control signal $DAC_{CB}'$ to the capacitive DAC 70 as the control signal $DAC_{CS}$ (first control signal) at the time of sampling the analog signal Vin.

The inverter 50 generates the control signal $DAC_{LSBs}'$ from the control signal $DAC_{LSBs}$ outputted from the successive approximation register 40. The inverter 50 generates, for example, inverted signals of control signals of the control signals $DAC_{LSBs}$ for the plurality of switch elements corresponding to the plurality of capacitive elements (third capacitive elements) corresponding to the M-th to (N−1)-th bits. For example, when "1" is inputted from the successive approximation register 40, the inverter 50 generates "0" as an inverted signal. For example, when "0" is inputted from the successive approximation register 40, the inverter 50 generates "1" as an inverted signal. The inverter 50 further replaces, for example, control signals of the control signals $DAC_{LSBs}$ for the plurality of switch elements corresponding to the plurality of capacitive elements (third capacitive elements) corresponding to the M-th to (N−1)-th bits with the above-described inverted signals, thereby generating the control signals $DAC_{CB}'$.

[Effects]

Next, the effects of the successive approximation register analog-to-digital converter 2 according to the present embodiment are described.

In the successive approximation register analog-to-digital converter 2 according to the present embodiment, the plurality of capacitive elements (first capacitive elements) corresponding to the whole or a portion of the correction bit CB has the total capacity corresponding to the total capacity of the plurality of capacitive elements (second capacitive elements) corresponding to the whole or a portion of the low-order bits LSBs (first to (N−1)-th bits). Further, the plurality of first capacitive elements is capacitive elements that do not corresponding to low bits. This makes it possible to reduce a DC shift that the output voltage of the capacitive digital-to-analog converter may undergo by inputting, for example, last ((k−1)-th time's) ADC conversion results to the respective capacitive elements corresponding to the low bits while inputting inverted signals of the last ((k−1)-th time's) ADC conversion results that are inputted to the respective second capacitive elements to the respective first capacitive elements, sampling the analog signal in this state, and then inputting reset signals to the respective capacitive elements. As a result, it is possible to expand the dynamic range of the successive approximation register analog-to-digital converter 2.

In addition, in the present embodiment, the plurality of first capacitive elements is capacitive elements corresponding to the correction bit CB. This makes it possible to reduce a DC shift that the output voltage of the capacitive digital-to-analog converter may undergo by inputting, for example, last ((k−1)-th time's) ADC conversion results to the respective capacitive elements corresponding to the low bits while inputting inverted signals of the last ((k−1)-th time's) ADC conversion results that are inputted to the respective second capacitive elements to the respective first capacitive elements, sampling the analog signal in this state, and then inputting reset signals to the respective capacitive elements.

As a result, it is possible to expand the dynamic range of the successive approximation register analog-to-digital converter 2.

In addition, in the present embodiment, the plurality of first capacitive elements is capacitive elements that do not correspond to the first to N-th bits (i.e., capacitive elements that correspond to the correction bit CB). This makes it possible to reduce a DC shift that an output voltage if the capacitive digital-to-analog converter 2 may undergo. As a result, it is possible to expand the dynamic range of the successive approximation register analog-to-digital converter 2.

In addition, in the present embodiment, the capacity of the respective capacitive elements corresponding to the low-order bits LSBs (first to (N−1)-th bits) is defined in (N−1)-bit binary. The capacity of the plurality of first capacitive elements corresponds to the capacity of the plurality of capacitive elements (third capacitive elements) corresponding to high-order bits (M-th to (N−1)-th bits (M represents an integer greater than or equal to 1 and less than or equal to N−1)) in the low-order bits LSBs (first to (N−1)-th bits). This makes it possible to reduce a DC shift that an output voltage if the capacitive digital-to-analog converter 2 may undergo. As a result, it is possible to expand the dynamic range of the successive approximation register analog-to-digital converter 2.

In addition, in the present embodiment, the total capacity of the plurality of first capacitive elements corresponds to the total capacity of the plurality of capacitive elements (third capacitive elements) corresponding to the whole of the high-order bits (M-th to (N−1)-th bits) in the low-order bits LSBs (first to (N−1)-th bits). This makes it possible to reduce a DC shift that an output voltage if the capacitive digital-to-analog converter 2 may undergo. As a result, it is possible to expand the dynamic range of the successive approximation register analog-to-digital converter 2.

In addition, in the present embodiment, inverted signals of control signals for the plurality of switch elements corresponding to the plurality of capacitive elements (third capacitive elements) corresponding to the M-th to (N−1)-th bits are outputted as the control signals $DAC_{M}s$ (first control signals) for the plurality of switch elements corresponding to the plurality of first capacitive elements when the analog signal Vin is sampled. This makes it possible to reduce a DC shift that an output voltage if the capacitive digital-to-analog converter 2 may undergo. As a result, it is possible to expand the dynamic range of the successive approximation register analog-to-digital converter 2.

3. Modification Example of Second Embodiment

Figure 6:
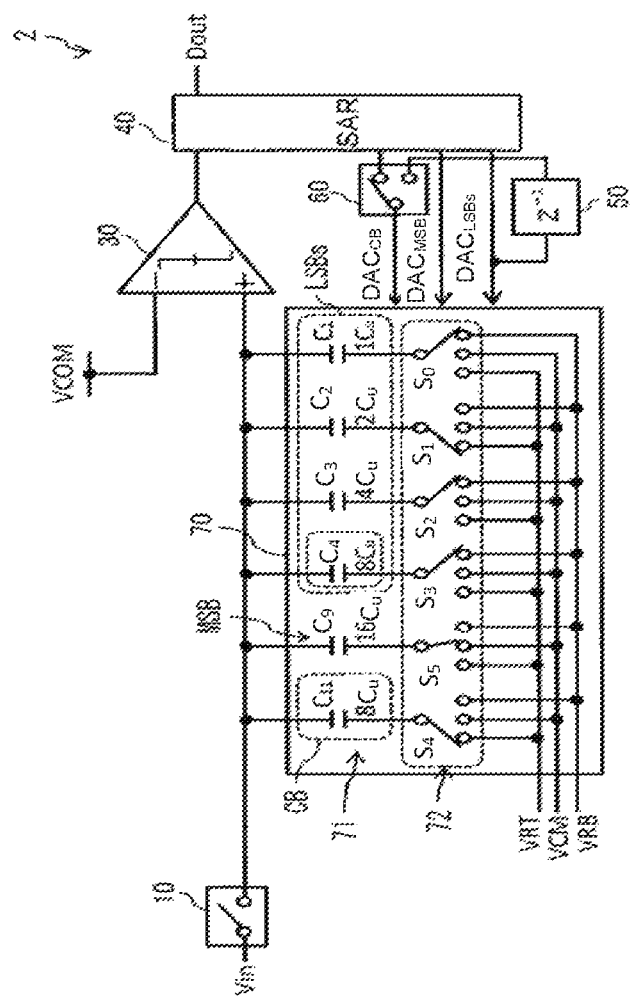
FIG. 6 is a diagram illustrating a modification example of the overview of the successive approximation register analog-to-digital converter in FIG. 5.

Next, a modification example of the successive approximation register analog-to-digital converter 2 according to the above-described second embodiment is described. FIG. 6 illustrates an overview of the successive approximation register analog-to-digital converter 2 according to the present modification example. The successive approximation register analog-to-digital converter 2 according to the present modification example corresponds to the successive approximation register analog-to-digital converter 2 according to the above-described second embodiment in which 1 is set as the number of capacitive elements corresponding to the correction bit CS.

The successive approximation register analog-to-digital converter 2 according to the present modification example converts the analog signal Vin inputted from the outside to the N-bit (N represents an integer greater than or equal to 5)

digital signal Dout. The successive approximation register analog-to-digital converter 2 according to the present modification example includes, for example, the switch 10, the capacitive DAC 70, the comparator 30, the successive approximation register 40, the inverter 50, and the selector 60.

The capacitive DAC 70 is N-bit capacitive DAC including a plurality of capacitive elements. It is to be noted that FIG. 6 exemplifies, as the plurality of capacitive elements, the six capacitive elements $C_1$, $C_2$, $C_3$, $C_4$, $C_9$, and $C_{11}$, for example. The capacity values of the respective capacitive elements $C_1$, $C_2$, $C_3$, $C_4$, $C_9$, and $C_{11}$ in FIG. 6 are illustrated near the respective capacitive elements. In addition, FIG. 6 exemplifies 5-bit capacitive DAC as the capacitive DAC 70. The capacitive DAC 70 includes N−1 capacitive elements corresponding to the low-order bits LSBs (first to (N−1)-th bits), one capacitive element corresponding to the most significant bit MSB (N-th bit), and one capacitive element for correction. Examples of the N−1 capacitive elements corresponding to the low-order bits LSBs (first to (N−1)-th bits) include the four capacitive elements $C_1$, $C_2$, $C_3$, and $C_4$ corresponding to the first to fourth bits. Examples of the one capacitive element corresponding to the most significant bit MSB (N-th bit) include the one capacitive element $C_9$ corresponding to the fifth bit. Examples of the one capacitive element corresponding to the correction bit CB include the one capacitive element $C_{11}$.

The most significant bit MSB includes one capacitive element. FIG. 6 illustrates, for example, the one capacitive element $C_9$ as the one capacitive element corresponding to the most significant bit MSB. The one capacitive element (e.g., one capacitive element $C_9$) corresponding to the most significant bit MSB is a capacitive element corresponding to the N-th bit (e.g., fifth bit), and a capacitive element that does not correspond to the first to (N−1)-th bits (e.g., first to fourth bits). The one capacitive element (e.g., one capacitive element $C_{11}$) corresponding to the correction bit CB is a capacitive element that does not correspond to the first to N-th bits.

One capacitive element (first capacitive element) in the correction bit CB has the capacity corresponding to the capacity of one capacitive element (second capacitive element) in the low-order bits LSBs (first to (N−1)-th bits). For example, the capacity of the one first capacitive element corresponds to the capacity of the one capacitive element (third capacitive element) corresponding to the most significant bits ((N−1)-th bit) in the low-order bits LSBs (first to (N−1)-th bits). For example, the capacity of the one first capacitive element corresponds to the capacity of the one capacitive element (third capacitive element) corresponding to the most significant bits ((N−1)-th bit) in the low-order bits LSBs (first to (N−1)-th bits). For example, as illustrated in FIG. 6, the capacity of the one capacitive element $C_{11}$ (first capacitive element) in the correction bit CB corresponds to the capacity of the one capacitive element $C_4$ (third capacitive element) surrounded by the dashed line in the low-order bits LSBs. For example, as illustrated in FIG. 6, the capacity of the one $C_{11}$ (first capacitive element) in the correction bit CB corresponds to the capacity ($8C_u$) of the one capacitive element $C_4$ (third capacitive element) surrounded by the dashed line in the low-order bits LSBs. The one capacitive element $C_{11}$ surrounded by the dashed line in the correction bit CB in FIG. 6 corresponds to specific examples of the "plurality of first capacitive elements" and the "capacitive elements that do not correspond to the first to N-th bits" of the present disclosure.

The capacity of the one capacitive element (first capacitive element) in the correction bit CB then corresponds to the capacity of the one capacitive elements (third capacitive element) corresponding to the M-th to (N−1)-th bits in the low-order bits LSBs. For example, as illustrated in FIG. 6, the one capacitive element $C_{11}$ (first capacitive element) and the one capacitive element $C_4$ (third capacitive element) include common capacitive elements. For example, the capacity of the capacitive element $C_{11}$ is $8C_u$.

The capacitive DAC 70 further includes a capacitive element array 71 and a switch element array 72. The capacitive element array 71 includes the plurality of capacitive elements corresponding to the low-order bits LSBs, the most significant bit MSB, and the correction bit CB. The switch element array 72 includes the plurality of switch elements coupled to the capacitive element array 71. One end of each capacitive element included in the capacitive element array 71 is coupled to a common node. The respective switch elements included in the switch element array 72 independently couple the other ends of the respective capacitive elements included in the capacitive element array 71 to any of the lowest reference voltage VRB, the common voltage VCM, and the highest reference voltage VRT.

The selector 60 controls the switching of the coupling between the capacitive element array 71 and the plurality of voltage lines (respective voltage lines of the lowest reference voltage VRB, common voltage VCM, and highest reference voltage VRT) via the switch element array 72. The selector 60 selects the control signal $DAC_{CB}$ outputted from the successive approximation register 40 and outputs the selected control signal $DAC_{CB}$ to the capacitive DAC 70 at the time of successive approximation. The selector 60 selects a control signal $DAC_{CB}'$ outputted from the inverter 50 and outputs the selected control signal $DAC_{CB}'$ to the capacitive DAC 70 as the control signal $DAC_{CS}$ (first control signal) at the time of sampling the analog signal Vin.

The inverter 50 generates the control signal $DAC_{LSBs}'$ from the control signal $DAC_{LSBs}$ outputted from the successive approximation register 40. The inverter 50 generates, for example, an inverted signal of a control signal of the control signals $DAC_{LSBs}$ for the one switch element corresponding to the one capacitive element (third capacitive element) corresponding to the (N−1)-th bit. For example, when "1" is inputted from the successive approximation register 40, the inverter 50 generates "0" as an inverted signal. For example, when "0" is inputted from the successive approximation register 40, the inverter 50 generates "1" as an inverted signal. The inverter 50 further replaces, for example, a control signal of the control signals $DAC_{LSBs}$ for the one switch element corresponding to the one capacitive element (third capacitive element) corresponding to the (N−1)-th bit with the above-described inverted signal, thereby generating the control signal $DAC_{CB}'$.

[Effects]

Next, the effects of the successive approximation register analog-to-digital converter 2 according to the present modification example are described.

In the successive approximation register analog-to-digital converter 2 according to the present modification example, one capacitive element (first capacitive element) in the correction bit CB has the capacity corresponding to the capacity of one capacitive element (second capacitive element) in the low-order bits LSBs (first to (N−1)-th bits). Further, the one first capacitive element is a capacitive element that does not corresponding to low bits. This makes it possible to reduce a DC shift that the output voltage of the capacitive digital-to-analog converter may undergo by inputting, for example, last ((k−1)-th time's) ADC conversion results to the respective capacitive elements corresponding to the low bits while inputting inverted signals of the last ((k−1)-th time's) ADC conversion results that are inputted to the second capacitive elements to the first capacitive elements, sampling the analog signal in this state, and then inputting reset signals to the respective capacitive elements. As a result, it is possible to expand the dynamic range of the successive approximation register analog-to-digital converter 2.

In addition, in the present modification example, the one first capacitive element is a capacitive element corresponding to the correction bit CB. This makes it possible to reduce a DC shift that the output voltage of the capacitive digital-to-analog converter may undergo by inputting, for example, last ((k−1)-th time's) ADC conversion results to the respective capacitive elements corresponding to the low bits while inputting inverted signals of the last ((k−1)-th time's) ADC conversion results that are inputted to the second capacitive elements to the first capacitive elements, sampling the analog signal in this state, and then inputting reset signals to the respective capacitive elements. As a result, it is possible to expand the dynamic range of the successive approximation register analog-to-digital converter 2.

In addition, in the present modification example, the one first capacitive element is a capacitive element that does not correspond to the first to N-th bits (i.e., capacitive element that corresponds to the correction bit CB). This makes it possible to reduce a DC shift that an output voltage if the capacitive digital-to-analog converter 2 may undergo. As a result, it is possible to expand the dynamic range of the successive approximation register analog-to-digital converter 2.

In addition, in the present modification, the capacity of the respective capacitive elements corresponding to the low-order bits LSBs (first to (N−1)-th bits) is defined in (N−1)-bit binary. The capacity of the one first capacitive element corresponds to the capacity of the one capacitive element (third capacitive element) corresponding to the most significant bits ((N−1)-th bit) in the low-order bits LSBs (first to (N−1)-th bits). This makes it possible to reduce a DC shift that an output voltage if the capacitive digital-to-analog converter 2 may undergo. As a result, it is possible to expand the dynamic range of the successive approximation register analog-to-digital converter 2.

In addition, in the present embodiment, the total capacity of the one first capacitive element corresponds to the capacity of the one capacitive element (third capacitive element) corresponding to the most significant bit ((N−1)-th bit) in the low-order bits LSBs (first to (N−1)-th bits). This makes it possible to reduce a DC shift that an output voltage if the capacitive digital-to-analog converter 2 may undergo. As a result, it is possible to expand the dynamic range of the successive approximation register analog-to-digital converter 2.

In addition, in the present embodiment, an inverted signal of a control signal for the one switch element corresponding to the one capacitive element (third capacitive element) corresponding to the (N−1)-th bit is outputted as the control signal $DAC_{MSB}$ (first control signal) for the one switch element corresponding to the one first capacitive element when the analog signal Vin is sampled. This makes it possible to reduce a DC shift that an output voltage if the capacitive digital-to-analog converter 2 may undergo. As a result, it is possible to expand the dynamic range of the successive approximation register analog-to-digital converter 2.

4. Third Embodiment

[Configuration]

Figure 7:
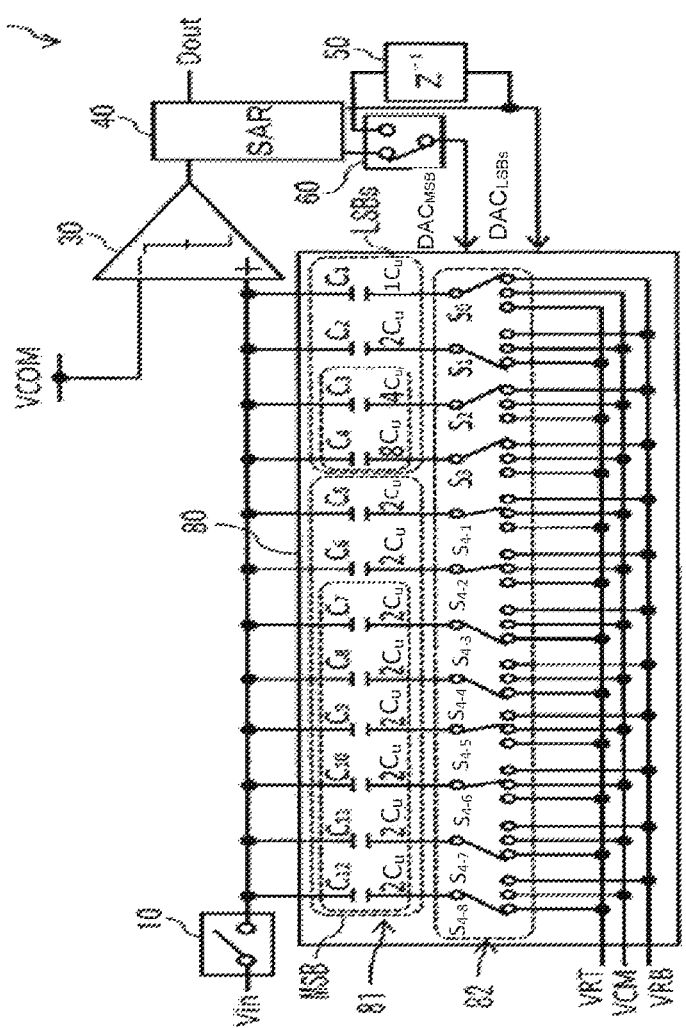
FIG. 7 is a diagram illustrating an overview of a successive approximation register analog-to-digital converter according to a third embodiment of the present disclosure.

A successive approximation register analog-to-digital converter 3 according to a third embodiment of the present disclosure is described. FIG. 7 illustrates an overview of the successive approximation register analog-to-digital converter 3. The successive approximation register analog-to-digital converter 3 converts the analog signal Vin inputted from the outside to the N-bit (N represents an integer greater than or equal to 5) digital signal Dout. The successive approximation register analog-to-digital converter 3 includes, for example, the switch 10, capacitive DAC 80, the comparator 30, the successive approximation register 40, the inverter 50, and the selector 60.

The switch 10 samples the analog signal Vin in predetermined cycles. The switch 10 includes, for example, a switch element.

The capacitive DAC 80 is N-bit capacitive DAC including a plurality of capacitive elements. It is to be noted that FIG. 7 exemplifies, as the plurality of capacitive elements, the twelve capacitive elements $C_1$, $C_2$, $C_3$, $C_4$, $C_5$, $C_6$, $C_7$, $C_8$, $C_9$, $C_{10}$, $C_{11}$, and $C_{12}$, for example. The capacity values of the respective capacitive elements $C_1$, $C_2$, $C_3$, $C_4$, $C_5$, $C_6$, $C_7$, $C_8$, $C_9$, $C_{10}$, $C_{11}$, and $C_{12}$ in FIG. 7 are illustrated near the respective capacitive elements. In addition, FIG. 7 exemplifies 5-bit capacitive DAC as the capacitive DAC 80. The capacitive DAC 20 includes N−1 capacitive elements corresponding to low-order bits LSBs (first to (N−1)-th bits) and a plurality of capacitive elements corresponding to a most significant bit MSB (N-th bit). Examples of the N−1 capacitive elements corresponding to the low-order bits LSBs (first to (N−1)-th bits) include the four capacitive elements $C_1$, $C_2$, $C_3$, and $C_4$ corresponding to the first to fourth bits. Examples of the plurality of capacitive elements corresponding to the most significant bit MSB (N-th bit) include the eight capacitive elements $C_5$, $C_6$, $C_7$, $C_8$, $C_9$, $C_{10}$, $C_{11}$, and $C_{12}$ corresponding to the fifth bit.

The low-order bits LSBs include, for example, the four capacitive elements $C_1$, $C_2$, $C_3$, and $C_4$. In the low-order bits LSBs, the capacitive element $C_1$ is a capacitive element corresponding to the first bit (least significant bit LSB), the capacitive element $C_2$ is a capacitive element corresponding to the second bit, the capacitive element $C_3$ is a capacitive element corresponding to the third bit, and the capacitive element $C_4$ is a capacitive element corresponding to the fourth bit.

The capacity of the respective capacitive elements corresponding to the low-order bits LSBs (first to (N−1)-th bits) is defined in (N−1)-bit binary. For example, the capacity of the respective capacitive elements $C_1$, $C_2$, $C_3$, and $C_4$ respectively corresponding to the low-order bits LSBs (first to fourth bits) is defined in 4-bit binary. For example, the capacity of the capacitive element $C_1$ is $1C_u$, the capacity of the capacitive element $C_2$ is $2C_u$, the capacity of the capacitive element $C_3$ is $4C_u$, and the capacity of the capacitive element $C_4$ is $8C_u$.

The most significant bit MSB includes a plurality of capacitive elements. FIG. 7 illustrates, for example, the eight capacitive elements $C_5$, $C_6$, $C_7$, $C_8$, $C_9$, $C_{10}$, $C_{11}$, and $C_{12}$ as the plurality of capacitive elements corresponding to the most significant bit MSB. The plurality of capacitive elements (e.g., eight capacitive elements $C_5$, $C_6$, $C_7$, $C_8$, $C_9$, $C_{10}$, $C_{11}$, and $C_{12}$) corresponding to the most significant bit MSB is capacitive elements corresponding to the N-th bit (e.g., fifth bit), and capacitive elements that do not correspond to the first to (N−1)-th bits (e.g., first to fourth bits).

The plurality of capacitive elements (first capacitive elements) corresponding to the whole or a portion of the most significant bit MSB has the total capacity corresponding to the total capacity of the plurality of capacitive elements (second capacitive elements) corresponding to the whole or a portion of the low-order bits LSBs (first to (N−1)-th bits). For example, the capacity of the plurality of first capacitive elements corresponds to the capacity of the plurality of capacitive elements (third capacitive elements) corresponding to the high-order bits (M-th to (N−1)-th bits) in the low-order bits LSBs (first to (N−1)-th bits). For example, the total capacity of the plurality of first capacitive elements corresponds to the total capacity of the plurality of capacitive elements (third capacitive elements) corresponding to the whole of the high-order bits (M-th to (N−1)-th bits) in the low-order bits LSBs (first to (N−1)-th bits). For example, as illustrated in FIG. 7, the six capacitive elements $C_7$, $C_8$, $C_9$, $C_{10}$, $C_{11}$, and $C_{12}$ (first capacitive elements) surrounded by the dashed line in the most significant bit MSB each have equal capacity. For example, the capacity thereof corresponds to the capacity of the one capacitive element $C_2$ (third capacitive element) in the low-order bits LSBs. For example, as illustrated in FIG. 7, the capacity of the six capacitive elements $C_7$, $C_8$, $C_9$, $C_{10}$, $C_{11}$, and $C_{12}$ (first capacitive elements) surrounded by the dashed line in the most significant bit MSB corresponds to the total capacity ($4C_u + 8C_u = 12C_u$) of the two capacitive elements $C_3$ and $C_4$ (third capacitive elements) surrounded by the dashed line in the low-order bits LSBs. The six capacitive elements $C_7$, $C_8$, $C_9$, $C_{10}$, $C_{11}$, and $C_{12}$ surrounded by the dashed line in the most significant bit MSB in FIG. 7 correspond to specific examples of the "plurality of first capacitive elements", the "capacitive elements corresponding to the N-th bit", and the "capacitive elements that do not correspond to the first to N-th bits" of the present disclosure.

The capacity of the plurality of capacitive elements (first capacitive elements) corresponding to the whole or a portion of the most significant bit MSB then corresponds to the capacity of the one capacitive element (third capacitive element) in the low-order bits LSBs. For example, as illustrated in FIG. 7, the six capacitive elements $C_7$, $C_8$, $C_9$, $C_{10}$, $C_{11}$, and $C_{12}$ (first capacitive elements) and the one capacitive elements $C_2$ (third capacitive element) include common capacitive elements. For example, the capacity of each of the capacitive elements $C_7$, $C_8$, $C_9$, $C_{10}$, $C_{11}$, and $C_{12}$ is $2C_u$.

The capacitive DAC 80 further includes a capacitive element array 81 and a switch element array 82. The capacitive element array 81 includes the plurality of capacitive elements corresponding to the low-order bits LSBs and the most significant bit MSB. The switch element array 82 includes the plurality of switch elements coupled to the capacitive element array 81. One end of each capacitive element included in the capacitive element array 81 is coupled to a common node. The respective switch elements included in the switch element array 82 independently couple the other ends of the respective capacitive elements included in the capacitive element array 81 to any of the lowest reference voltage VRB, the common voltage VCM, and the highest reference voltage VRT.

The comparator 30 compares, for example, the voltage (comparison signal) of the common node (output of the capacitive DAC 80) and a standard voltage (common voltage VCM), and outputs a determination result of the magnitude relationship therebetween to the successive approximation register 40.

The successive approximation register 40 successively accumulates output signals of the comparator 30 and outputs the digital signal Dout. The successive approximation register 40 further outputs, for example, the digital signal Dout to the capacitive DAC 80 as the control signals ($DAC_{MSB}$ and $DAC_{LSBs}$).

The selector 60 controls the switching of the coupling between the capacitive element array 81 and the plurality of voltage lines (respective voltage lines of the lowest reference voltage VRB, common voltage VCM, and highest reference voltage VRT) via the switch element array 82. The selector 60 selects the control signal $DAC_{MSB}$ outputted from the successive approximation register 40 and outputs the selected control signal $DAC_{MSB}$ to the capacitive DAC 80 at the time of successive approximation. The selector 60 selects the control signal $DAC_{LSBs}'$ outputted from the inverter 50 and outputs the selected control signal $DAC_{LSBs}'$ to the capacitive DAC 80 as the control signal $DAC_{MSB}$ (first control signal) at the time of sampling the analog signal Vin.

The inverter 50 generates the control signal $DAC_{LSBs}'$ from the control signal $DAC_{LSBs}$ outputted from the successive approximation register 40. The inverter 50 generates, for example, inverted signals of control signals of the control signals $DAC_{LSBs}$ for the plurality of switch elements corresponding to the plurality of capacitive elements (third capacitive elements) corresponding to the M-th to N1-th bits. For example, when "1" is inputted from the successive approximation register 40, the inverter 50 generates "0" as an inverted signal. For example, when "0" is inputted from the successive approximation register 40, the inverter 50 generates "1" as an inverted signal. The inverter 50 further replaces, for example, control signals of the control signals $DAC_{LSBs}$ for the plurality of switch elements corresponding to the plurality of capacitive elements (third capacitive elements) corresponding to the M-th to (N−1)-th bits with the above-described inverted signals, thereby generating the control signals $DAC_{LSBs}'$.

[Effects]

Next, the effects of the successive approximation register analog-to-digital converter 3 according to the present embodiment are described.

In the successive approximation register analog-to-digital converter 3 according to the present embodiment, the plurality of capacitive elements (first capacitive elements) corresponding to the whole or a portion of the most significant bit MSB has the total capacity corresponding to the total capacity of the plurality of capacitive elements (second capacitive elements) corresponding to the whole or a portion of the low-order bits LSBs (first to (N−1)-th bits). Further, the plurality of first capacitive elements is capacitive elements that do not corresponding to low bits. This makes it possible to reduce a DC shift that the output voltage of the capacitive digital-to-analog converter may undergo by inputting, for example, last ((k−1)-th time's) ADC conversion results to the respective capacitive elements corresponding to the low bits while inputting inverted signals of the last ((k−1)-th time's) ADC conversion results that are inputted to the respective second capacitive elements to the respective first capacitive elements, sampling the analog signal in this state, and then inputting reset signals to the respective capacitive elements. As a result, it is possible to expand the dynamic range of the successive approximation register analog-to-digital converter 3.

In addition, in the present embodiment, the plurality of first capacitive elements is capacitive elements corresponding to the most significant bit MSB (N-th bit). This makes it possible to reduce a DC shift that the output voltage of the capacitive digital-to-analog converter may undergo by inputting, for example, last ((k−1)-th time's) ADC conversion results to the respective capacitive elements corresponding to the low bits while inputting inverted signals of the last ((k−1)-th time's) ADC conversion results that are inputted to the respective second capacitive elements to the respective first capacitive elements, sampling the analog signal in this state, and then inputting reset signals to the respective capacitive elements. As a result, it is possible to expand the dynamic range of the successive approximation register analog-to-digital converter 3.

In addition, in the present embodiment, the capacity of the respective capacitive elements corresponding to the low-order bits LSBs (first to (N−1)-th bits) is defined in (N−1)-bit binary. The capacity of each of the plurality of first capacitive elements corresponds to the capacity of one specific capacitive element corresponding to the first to (N−1)-th bits. This makes it possible to reduce a DC shift that an output voltage if the capacitive digital-to-analog converter 1 may undergo. As a result, it is possible to expand the dynamic range of the successive approximation register analog-to-digital converter 3.

In addition, in the present embodiment, the total capacity of the plurality of first capacitive elements corresponds to the total capacity of the plurality of capacitive elements (third capacitive elements) corresponding to the whole of the high-order bits (M-th to (N−1)-th bits) in the low-order bits LSBs (first to (N−1)-th bits). This makes it possible to reduce a DC shift that an output voltage if the capacitive digital-to-analog converter 1 may undergo. As a result, it is possible to expand the dynamic range of the successive approximation register analog-to-digital converter 3.

In addition, in the present embodiment, inverted signals of control signals for the plurality of switch elements corresponding to the plurality of capacitive elements (third capacitive elements) corresponding to the M-th to (N−1)-th bits are outputted as the control signals $DAC_{M}s$ (first control signals) for the plurality of switch elements corresponding to the plurality of first capacitive elements when the analog signal Vin is sampled. This makes it possible to reduce a DC shift that an output voltage if the capacitive digital-to-analog converter 1 may undergo. As a result, it is possible to expand the dynamic range of the successive approximation register analog-to-digital converter 3.

5. Modification Example of Third Embodiment

Figure 8:
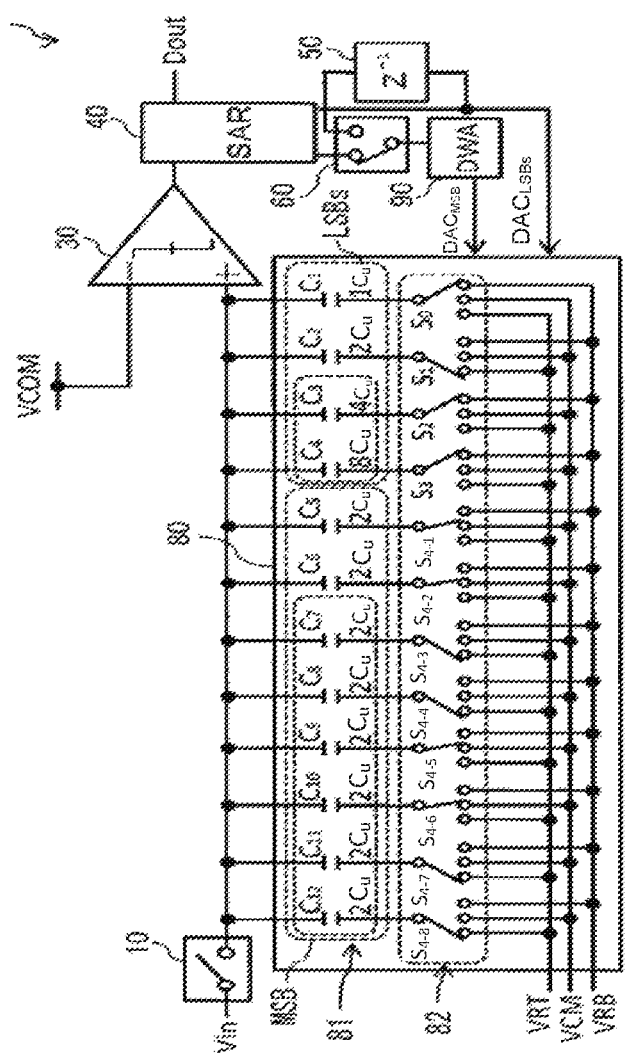
FIG. 8 is a diagram illustrating a modification example of the overview of the successive approximation register analog-to-digital converter in FIG. 7.

Next, a modification example of the successive approximation register analog-to-digital converter 3 according to the above-described third embodiment is described. FIG. 8 illustrates an overview of the successive approximation register analog-to-digital converter 3 according to the present modification example. The successive approximation register analog-to-digital converter 3 according to the present modification example corresponds to the successive approximation register analog-to-digital converter 3 according to the above-described third embodiment further including DWA (Data Weighted Averaging) 90.

The DWA 90 outputs "1" to switch elements corresponding to any predetermined number of capacitive elements of the plurality of capacitive elements included in the most significant bit MSB. The DWA 90 repeatedly outputs "1" to a switch element group corresponding to a predetermined number of possible combinations of the plurality of capacitive elements included in the most significant bit MSB. This makes it possible to reduce a DC shift caused by a capacity variation among the plurality of capacitive elements included in the most significant bit MSB. As a result, it is possible to expand the dynamic range of the successive approximation register analog-to-digital converter 3.

As described above, although the present disclosure has been described by presenting the plurality of embodiments and modification examples thereof, the present disclosure is not limited to the above-described embodiments or the like. Various modifications are possible. It is to be noted that the effects described herein are merely illustrative. The effects of the present disclosure are not limited to the effects described herein. The present disclosure may have effects other than the effects described herein.

In addition, for example, it is possible to configure the present disclosure as follows.

(1)

A successive approximation register analog-to-digital converter including an N-bit (N represents an integer greater than or equal to 5) capacitive digital-to-analog converter including a plurality of capacitive elements, in which a plurality of first capacitive elements of the plurality of capacitive elements is capacitive elements that have total capacity corresponding to total capacity of a plurality of the capacitive elements corresponding to a whole or a portion of first to (N−1)-th bits, and do not correspond to the first to (N−1)-th bits.

(2)

The successive approximation register analog-to-digital converter according to (1), in which the plurality of first capacitive elements is the capacitive elements corresponding to an N-th bit.

(3)

The successive approximation register analog-to-digital converter according to (1), in which the plurality of first capacitive elements is the capacitive elements that do not correspond to first to N-th bits.

(4)

The successive approximation register analog-to-digital converter according to any one of (1) to (3), in which capacity of the respective capacitive elements corresponding to the first to (N−1)-th bits is defined in (N−1)-bit binary, and capacity of the plurality of first capacitive elements corresponds to capacity of a plurality of the capacitive elements corresponding to M-th to (N−1)-th bits (M represents an integer greater than or equal to 1 and less than or equal to N−1).

(5)

The successive approximation register analog-to-digital converter according to (4), in which total capacity of the plurality of first capacitive elements corresponds to total capacity of a plurality of the capacitive elements corresponding to a whole of the M-th to (N−1)-th bits (M represents an integer greater than or equal to 1 and less than or equal to N−1).

(6)

The successive approximation register analog-to-digital converter according to any one of (1) to (3), in which capacity of the respective capacitive elements corresponding to the first to (N−1)-th bits is defined in (N−1)-bit binary, and capacity of each of the plurality of first capacitive elements corresponds to capacity of the one specific capacitive element corresponding to the first to (N−1)-th bits.

(7)

The successive approximation register analog-to-digital converter according to (6), in which total capacity of the plurality of first capacitive elements corresponds to total capacity of a plurality of the capacitive elements corresponding to a whole of M-th to (N−1)-th bits (M represents an integer greater than or equal to 1 and less than or equal to N−1).

(8)

The successive approximation register analog-to-digital converter according to any one of (2) to (7), in which capacity of the respective capacitive elements corresponding to the first to (N−1)-th bits is defined in (N−1)-bit binary, capacity of the plurality of first capacitive elements corresponds to capacity of a plurality of the capacitive elements corresponding to M-th to (N−1)-th bits (M represents an integer greater than or equal to 1 and less than or equal to N−1), the capacitive digital-to-analog converter includes
  a capacitive element array including the plurality of capacitive elements, and
  a switch element array including a plurality of switch elements coupled to the capacitive element array, and the successive approximation register analog-to-digital converter further includes a controller that controls switching of coupling between the capacitive element array and a plurality of voltage lines via the switch element array, the controller outputting inverted signals of control signals for a plurality of the switch elements corresponding to a plurality of the capacitive elements corresponding to the M-th to (N−1)-th bits as first control signals for a plurality of the switch elements corresponding to the plurality of first capacitive elements when an analog signal is sampled.

(9)

A successive approximation register analog-to-digital converter including an N-bit (N represents an integer greater than or equal to 4) capacitive digital-to-analog converter including a plurality of capacitive elements, in which one first capacitive element of the plurality of capacitive elements is a capacitive element that has capacity corresponding to capacity of the one capacitive element included in first to (N−1)-th bits, and does not correspond to first to N-th bits.

(10)

The successive approximation register analog-to-digital converter according to (9), in which capacity of the respective capacitive elements corresponding to the first to (N−1)-th bits is defined in (N−1)-bit binary, capacity of the first capacitive element corresponds to capacity of the one capacitive element corresponding to M-th to (N−1)-th bits (M represents an integer greater than or equal to 1 and less than or equal to N−1), the capacitive digital-to-analog converter includes
  a capacitive element array including the plurality of capacitive elements, and
  a switch element array including a plurality of switch elements coupled to the capacitive element array, and the successive approximation register analog-to-digital converter further includes a controller that controls switching of coupling between the capacitive element array and a plurality of voltage lines via the switch element array, the controller outputting control signals for the switch element corresponding to the one capacitive element corresponding to the M-th to (N−1)-th bits as a first control signal for the switch element corresponding to the first capacitive element.

The first and second successive approximation register analog-to-digital converters according to the respective embodiments of the present disclosure each make it possible to reduce a DC shift that an output voltage of the capacitive digital-to-analog converter may undergo. This makes it possible to expand the dynamic range of the SARADC. It is to be noted that the effects of the present disclosure are not necessarily limited to the effects described here, but may include any of the effects described herein.

This application claims the priority on the basis of Japanese Patent Application No. 2018-003216 filed on Jan. 12, 2018 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A successive approximation register analog-to-digital converter, comprising:
  an N-bit capacitive digital-to-analog converter that includes a capacitive element array and a switch element array, wherein
    the capacitive element array includes a plurality of capacitive elements,
    N is an integer greater than or equal to 5,
    a plurality of first capacitive elements of the plurality of capacitive elements have total capacity that corresponds to total capacity of a plurality of second capacitive elements of the plurality of capacitive elements,
    the plurality of second capacitive elements correspond to one of a whole or a portion of first to (N−1)-th bits, and
    the plurality of first capacitive elements do not correspond to the first to (N−1)-th bits; and
  a controller configured to:
    control switching of coupling between the capacitive element array and a plurality of voltage lines via the switch element array; and
    output inverted signals of first control signals as second control signals for a plurality first switch elements of the switch element array that correspond to the plurality of first capacitive elements, wherein
      the output of the inverted signals is based on sample of an analog signal,
      the first control signals is for a plurality of second switch elements of the switch element array, and
      the plurality of second switch elements correspond to a plurality of third capacitive elements of the plurality of capacitive elements corresponding to M-th to (N−1)-th bits, where M is an integer greater than or equal to 1 and less than or equal to N−1.

2. The successive approximation register analog-to-digital converter according to claim 1, wherein the plurality of first capacitive elements correspond to an N-th bit.

3. The successive approximation register analog-to-digital converter according to claim 1, wherein
  capacity of respective capacitive elements that correspond to the first to (N−1)-th bits is defined in (N−1)-bit binary, and
  capacity of the plurality of first capacitive elements corresponds to capacity of the plurality of third capacitive elements of the plurality of capacitive elements that correspond to M-th to (N−1)-th bits.

4. The successive approximation register analog-to-digital converter according to claim 3, wherein the total capacity of the plurality of first capacitive elements corresponds to total capacity of the plurality of the third capacitive elements.

5. The successive approximation register analog-to-digital converter according to claim 1, wherein
capacity of respective capacitive elements that corresponds to the first to (N−1)-th bits is defined in (N−1)-bit binary, and
capacity of each of the plurality of first capacitive elements corresponds to capacity of one specific capacitive element that correspond to the first to (N−1)-th bits.

6. The successive approximation register analog-to-digital converter according to claim 5, wherein
the total capacity of the plurality of first capacitive elements corresponds to total capacity of the plurality of third capacitive elements of the plurality of capacitive elements that correspond to a whole of M-th to (N−1)-th bits.

7. The successive approximation register analog-to-digital converter according to claim 2, wherein
capacity of respective capacitive elements that corresponds to the first to (N−1)-th bits is defined in (N−1)-bit binary, and
capacity of the plurality of first capacitive elements corresponds to capacity of the plurality of third capacitive elements of the plurality of capacitive elements that correspond to M-th to (N−1)-th bits.

8. A successive approximation register analog-to-digital converter, comprising:
an N-bit capacitive digital-to-analog converter that includes a capacitive element array and a switch element array, wherein
the capacitive element array includes a plurality of capacitive elements,
N is an integer greater than or equal to 4,
one first capacitive element of the plurality of capacitive elements has capacity that corresponds to capacity of one second capacitive element of the plurality of capacitive elements,
the one second capacitive element is included in first to (N−1)-th bits, and
the one first capacitive element docs not corresponds to at least one bit other than the first to (N−1)-th bits; and
a controller configured to:
control switching of coupling between the capacitive element array and a plurality of voltage lines via the switch element array; and
output first control signals as a second control signal for a first switch element of the switch element array that correspond to the one first capacitive element, wherein
the first control signals is for a second switch element of the switch element array that correspond to the one second capacitive element.

9. The successive approximation register analog-to-digital converter according to claim 8, wherein
capacity of respective capacitive elements that corresponds to the first to (N−1)-th bits is defined in (N−1)-bit binary, and
the capacity of the one first capacitive element corresponds to the capacity of the one second capacitive element that corresponds to M-th to (N−1)-th bits.

10. The successive approximation register analog-to-digital converter, according to claim 1, further comprising
a specific capacitive element that corresponds to N-th bit, wherein
the specific capacitive element is between the plurality of first capacitive elements and the plurality of third capacitive elements, and
a total value of the specific capacitive element is higher than the total capacity of the plurality of first capacitive elements.

* * * * *